United States Patent
Lee et al.

(10) Patent No.: US 6,610,596 B1
(45) Date of Patent: Aug. 26, 2003

(54) METHOD OF FORMING METAL INTERCONNECTION USING PLATING AND SEMICONDUCTOR DEVICE MANUFACTURED BY THE METHOD

(75) Inventors: Jong-won Lee, Kyungki-do (KR); Bo-un Yoon, Seoul (KR); Kun-tack Lee, Suwon (KR); Sang-rok Hah, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 5 days.

(21) Appl. No.: 09/662,120

(22) Filed: Sep. 14, 2000

(30) Foreign Application Priority Data

Sep. 15, 1999 (KR) .............................. 99-39548
Jul. 22, 2000 (KR) ............................. 00-42153

(51) Int. Cl.$^7$ ................................. H01L 21/44
(52) U.S. Cl. .................. 438/653; 438/645; 438/648; 438/650; 438/654; 438/678; 438/679; 438/680; 438/687; 438/691; 438/692; 438/653; 257/751; 257/752; 257/753; 257/762
(58) Field of Search ................. 438/653, 645, 438/654, 678, 679, 686, 691, 692, 648, 650, 687, 699, 627; 205/186; 257/751, 752, 753, 762

(56) References Cited

U.S. PATENT DOCUMENTS

| | | | | |
|---|---|---|---|---|
| 5,933,758 A | * | 8/1999 | Jain ............................. | 438/687 |
| 5,939,788 A | * | 8/1999 | McTeer ........................ | 257/751 |
| 6,015,749 A | * | 1/2000 | Liu et al. ..................... | 438/628 |
| 6,037,258 A | * | 3/2000 | Liu et al. ..................... | 438/687 |
| 6,054,378 A | * | 4/2000 | Skala et al. .................. | 438/620 |
| 6,069,068 A | * | 5/2000 | Rathore et al. .............. | 438/638 |
| 6,077,780 A | * | 6/2000 | Dubin ........................... | 438/687 |
| 6,083,840 A | * | 7/2000 | Mravic et al. ............... | 438/693 |
| 6,146,517 A | * | 11/2000 | Hoinkis ........................ | 205/186 |
| 6,204,179 B1 | * | 3/2001 | McTeer ........................ | 438/687 |
| 6,291,352 B1 | * | 9/2001 | Woerlee et al. .............. | 438/699 |

FOREIGN PATENT DOCUMENTS

| | | |
|---|---|---|
| KR | 97-18085 | 4/1997 |
| KR | 2000-0017630 | 3/2000 |

* cited by examiner

*Primary Examiner*—Matthew Smith
*Assistant Examiner*—Belur V Keshavan
(74) *Attorney, Agent, or Firm*—Volentine Francos, PLLC

(57) ABSTRACT

A method is provided for forming a metal interconnection using a plating process, which can improve the throughput and reliability of semiconductor devices by decreasing the required polishing in a chemical mechanical polishing process. A semiconductor device manufactured by this method is also provided. In the method of forming a metal interconnection, a recess region is formed in a portion of an insulation layer formed over a substrate, i.e., where a metal interconnection layer will be formed. A diffusion prevention layer is formed over the substrate, the insulation layer, and the recess region. Then, a metal seed layer is formed over the diffusion prevention layer only in the recess region using a chemical mechanical polishing process or an etch back process. A conductive plating layer is then formed on the metal seed layer only in the recess region. Thereafter, surface polarization is performed to form a metal interconnection layer in the recess region. The plating layer may be formed after forming the seed layer only in the bottom portion of the recess region.

14 Claims, 7 Drawing Sheets

METHOD OF FORMING METAL INTERCONNECTION USING PLATING AND SEMICONDUCTOR DEVICE MANUFACTURED BY THE METHOD

This application relies for priority upon Korean Patent Application Nos. 99-39548 and 00-42153, filed on Sep. 15, 1999, and Jul. 22, 2000, respectively, the contents of which are herein incorporated by reference in their entirety.

BACKGROUND OF THE INVENTION

The present invention relates to a method of forming a metal interconnection using plating and a semiconductor device manufactured by the method. More particularly, the present invention relates to a method for manufacturing a metal interconnection in a semiconductor device having a damascene structure and a semiconductor device manufactured by such a method.

In order to reduce RC delay time in a semiconductor device, a method has been studied of forming a metal interconnection layer using metal such as copper, which has a low resistivity. A reduction in RC delay time is particularly useful in logic devices that require a high operation speed.

In one method of forming a metal interconnection material, a metal interconnection material, such as aluminum, is formed over the entire surface of a substrate and the resultant structure is patterned by a conventional photolithography process. However, a different method is used when forming a metal interconnection layer with copper (Cu) as a metal interconnection material because it is difficult to perform a patterning process with respect to copper. In order to form a metal interconnection layer using this process, a region where a metal interconnection is to be made is formed in an insulation layer on a substrate in advance, and then this area is filled with a metal interconnection material. A so-called "damascene" process is used to achieve this method.

FIGS. 1 through 3 are sectional views for explaining a method of forming a metal interconnection of a semiconductor device having a conventional line damascene structure. In the line damascene structure, a trench having a predetermined depth from the surface of an insulation layer is formed in a line and a metal interconnection layer is formed in the trench. A method of forming a metal interconnection of a line damascene structure will now be described with reference to the attached drawings.

Referring to FIG. 1, a trench region 11 of a line shape is formed by performing a photolithography process on an insulation layer 10, which is formed over a substrate 5. Subsequently, a diffusion prevention layer 12 is formed over the entire surface of the insulation layer 10, including the trench region 11. Next, copper is deposited over the diffusion prevention layer 12 by a physical vapor deposition (PVD) method such as sputtering, thereby forming a seed layer 14.

Referring to FIG. 2, a plating layer 16 of copper is then formed over the resultant structure, including the seed layer 14, using an electroplating method. The plating layer 16 is formed thick enough to completely fill the trench region 11.

Referring to FIG. 3, some of the plating layer 16 is then removed by a chemical-mechanical polishing (CMP) process until a portion of the insulation layer 10 is exposed. As a result of this, remaining portions of the diffusion prevention layer 12 and the seed layer 14, as well as a metal interconnection layer 16a that is formed from the portion of the plating layer 16 remains within each trench region 11, in the vicinity of the surface of the insulation layer 10.

FIGS. 4 through 7 are a plan view and section views for explaining a method of forming a metal interconnection of a semiconductor device having a conventional dual damascene structure. In the dual damascene structure, a metal interconnection formed to fill a trench region of a line shape is combined with a contact filling a contact hole or a via-hole in order to connect to an underlying conductive layer. A method of forming a metal interconnection of a dual damascene structure will be described below.

Referring to FIG. 4, lower conductive layers 28 are formed over a substrate 5 at a predetermined interval. Metal interconnection layers 26a are formed over the lower conductive layers 28 at another predetermined interval. An insulation layer (not shown in FIG. 4) is interposed between the metal interconnection layer 26a and the underlying lower conductive layer 28. The metal interconnection layer 26a is electrically connected to the underlying lower conductive layer 28 through a contact hole region 30. FIGS. 5 through 7 are sectional views of FIG. 4 taken along the line VII–VII', and show the sequential steps of fabricating the device of FIG. 4.

Referring to FIG. 5, a conductive material is deposited and patterned over a substrate 15 to form lower conductive layers 28 at regular intervals. Subsequently, an insulation layer 20 is formed over the entire surface of the resultant structure, including the lower conductive layers 28. A typical photolithography process is then performed on the insulation layer 20 to form a contact hole region 30 and a trench region 31 that includes the contact hole region 30. Next, a diffusion prevention layer 22 and a seed layer 24 are sequentially formed over the entire surface of the resultant structure, including the contact hole region 30 and the trench region 31.

Referring to FIG. 6, the substrate 15 over which the seed layer 24 is formed is then loaded into an electroplating apparatus and is electroplated to form a plating layer 26 of copper.

Referring to FIG. 7, the surface of the substrate 15, including the plating layer 26, is then planarized by a chemical mechanical polishing (CMP) process. This surface polarization is performed on the plating layer 26, the seed layer 24, and the diffusion prevention layer 22 until the surface of the insulation layer 20 is exposed. In this way a metal interconnection layer 26a is formed that has a dual damascene structure and a planarized surface, as shown in FIG. 7.

However, the method described above of forming a metal interconnection having a line or dual damascene structure has several problems. First, copper must be thickly deposited to make certain that enough copper is deposited to form a layer that fills the trench region 31 and has at least a predetermined thickness over the insulation layer 24, taking into account the depth of the trench region 31 and contact hole region 30, and the parameters of the chemical mechanical polishing (CMP) process. Thus, the amount of copper subject to the polishing is large. This decreases the throughput of the fabrication process decreases, and increases fabrication expense.

Second, as the amount of copper subject to the polishing increases, the uniformity of the chemical mechanical polishing (CMP) process is degraded. This causes the thickness of a metal interconnection layer 26a finally formed in a substrate 15 to vary according to its location, which directly affects the reliability and throughput of the devices.

Third, when removing the copper layer using the chemical mechanical polishing (CMP) process, corrosion of the insulation layer 24 occurs according to the density of a metal interconnection layer pattern. This also causes the thicknesses of the metal interconnection layers 26a in a substrate 15 to vary, which, as noted above, results in defects.

Fourth, different slurries must be used when polishing a seed layer 24 and a diffusion prevention layer 22 when the seed layer 24 and the diffusion prevention layer 22 have different polishing speeds. This complicates the chemical mechanical polishing (CMP) process and increases fabrication expense.

Fifth, in a dual damascene structure, the aspect ratio of a contact hole region 30 is very large, which may result in the formation of a void 32 during electroplating, as shown in FIG. 6. Such a void 32, as shown in FIG. 7, remains as a void defect 32a on the surface of the metal interconnection layer 26a after surface polarization, thereby deteriorating the reliability of the resulting devices.

SUMMARY OF THE INVENTION

It is a first objective of the present invention to provide a method of forming a metal interconnection using a plating process, which can improve the throughput and reliability of semiconductor devices by decreasing the required polishing in a chemical mechanical polishing (CMP) process.

It is a second objective of the present invention to provide a semiconductor device, which decreases the variation in the thicknesses of metal interconnection layers in a given substrate, and removes void defects, thereby improving the reliability of the device.

To achieve the first objective, the present invention provides a method of forming a metal interconnection. This method comprises forming an insulation region on a substrate; forming a recess region in the insulation layer; forming a diffusion prevention layer over insulation layer and the recess region; forming a metal seed layer over the diffusion prevention layer only in the recess region; and forming a conductive plating layer on the seed layer using plating process.

The recess region may comprise a trench region of a line shape having a predetermined depth from a top surface of the insulation layer. The recess region, may also comprise a trench region of a line shape having a predetermined depth from the surface of the insulation layer; and a contact hole region passing through the insulation layer.

Forming the metal seed layer may further comprise forming a preliminary seed layer over the diffusion prevention layer; and removing a first portion of the preliminary seed layer outside of the recess region such that a second portion of the preliminary seed layer in the recess region forms the metal seed layer. Forming the preliminary seed layer is preferably performed by a physical vapor deposition (PVD) method or a chemical vapor deposition (CVD) method.

Removing a first portion of the preliminary seed layer is preferably performed by a chemical mechanical polishing (CMP) process. The slurry used for the chemical mechanical polishing (CMP) process preferably does not contain abrasives. The chemical-mechanical polishing (CMP) process preferably uses a slurry having a polishing selection ratio of 10:1–1000:1 with respect to the preliminary seed layer and the diffusion prevention layer.

Removing a first portion of the preliminary seed layer preferably leaves the second portion of the preliminary seed layer and a third portion of the preliminary seed layer in the recess region. In addition, the method may further comprise performing a wet etching process on the third portion of the preliminary seed layer to remove the third portion of the seed layer from the recess region. The wet etching process is preferably time-controlled.

The second portion of the preliminary seed layer is preferably formed only on a bottom surface of the recess region.

Removing a first portion of the preliminary seed layer may further comprise forming an intermediate material layer over the preliminary seed layer to fill the recess region; etching back and removing a first portion of the intermediate material layer and the first portion of the preliminary seed layer until a portion of the diffusion prevention layer outside the recess region is exposed; and removing a second portion of the intermediate material layer remaining in the recess region. The intermediate material layer preferably comprises a photoresist material.

The method may further comprise performing a surface polarization process on the conductive plating layer and the diffusion prevention layer to expose a top surface of the insulation layer and to form a metal interconnection layer in the recess region. The surface polarization is preferably performed by a chemical mechanical polishing process using a slurry having nearly the same polishing speeds with respect to the diffusion prevention layer and the plating layer.

To achieve the second objective, the present invention provides a semiconductor device including a substrate; an insulation layer formed over the substrate, the insulation layer having a recess region is formed in it; a diffusion prevention layer formed over the insulation layer and in the recess region; a metal seed layer formed over the diffusion prevention layer and in the recess region; and a metal interconnection layer formed in the recess region on the metal seed layer therein.

The recess region preferably comprises a trench region of a line shape having a predetermined depth from the surface of the insulation layer, and the metal seed layer is formed over a bottom portion of the trench region.

The semiconductor device may further comprising a lower conductive layer formed over the substrate. The recess region may comprises a contact hole region that passes through the insulation layer and exposes the lower conductive layer. In this case, the diffusion prevention layer is preferably formed in the contact hole region and over the lower conductive layer, and the metal seed layer is preferably formed over the bottom portion of the contact hole.

The recess region may further comprise a trench region of a line shape having a predetermined depth from the surface of the insulation layer. In this case, the metal seed layer is preferably formed over a bottom portion of the contact hole and a bottom portion of the trench region.

The diffusion prevention layer preferably comprises a material selected from the group consisting of a tantalum (Ta), tantalum nitride (TaN), tantalum aluminum nitride (TaAlN), tantalum silicon nitride (TaSiN), tantalum silicide ($TaSi_2$), titanium (Ti), titanium nitride (TiN), titanium silicon nitride (TiSiN), tungsten nitride (WN), cobalt (Co), cobalt silicide ($CoSi_2$), and a composite layer comprising at least two of these materials. The metal seed layer preferably comprises a material selected from the transition metal group of copper, platinum, palladium, rubidium, strontium, rhodium, and cobalt. Preferably, the metal seed layer and the metal interconnection layer both comprise copper.

According to the present invention, the plating layer is formed only in the recess region in which the metal interconnection layer will be formed so that the plating layer does not have to be formed any thicker than needed, thus greatly reducing the amount of metal to be polished during a subsequent CMP process. This improves fabrication throughput and decreases fabrication expense.

In addition, since the amount of the plating layer to be polished by the polishing process is small, the uniformity of the CMP process in a given substrate is excellent, which decreases the variation in the thicknesses of the metal interconnection layers formed in the substrate. Moreover, this can prevent dishing or corrosion of the insulation layer because the polishing process does not need to be excessively performed.

Furthermore, the fabrication process is simplified by allowing the use of a slurry having nearly the same polishing speed with respect to the plating layer and the diffusion prevention layer when polishing the plating layer and the diffusion prevention layer.

Moreover, the seed layer on the sidewalls of the recess region is removed by a wet etching process, which decreases the aspect ratio of the recess region. This improves the gap-filling performance of the plating layer, thereby preventing void defects. Consequently, this improves the reliability of the resulting semiconductor devices.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

The present invention will now be described in greater detail with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art.

First Preferred Embodiment

Figure 1:
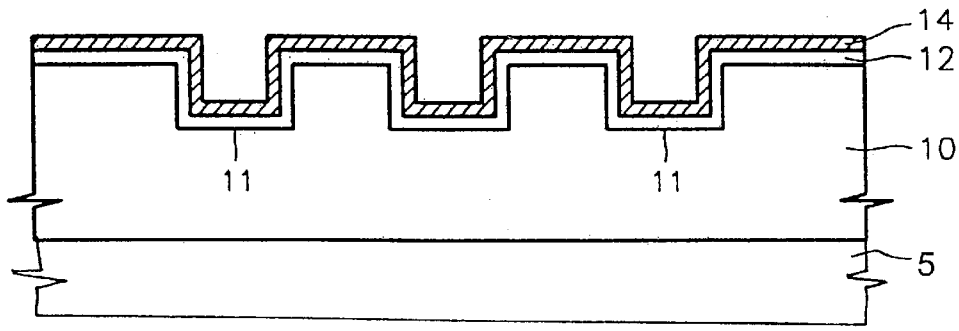
FIGS. 1 through 3 are sectional views showing a method of forming a metal interconnection in a semiconductor device having a conventional line damascene structure.
Figure 2:
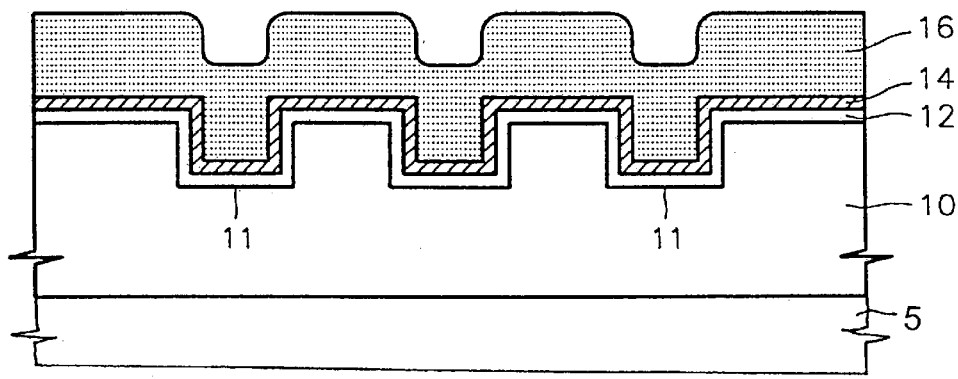
Figure 3:
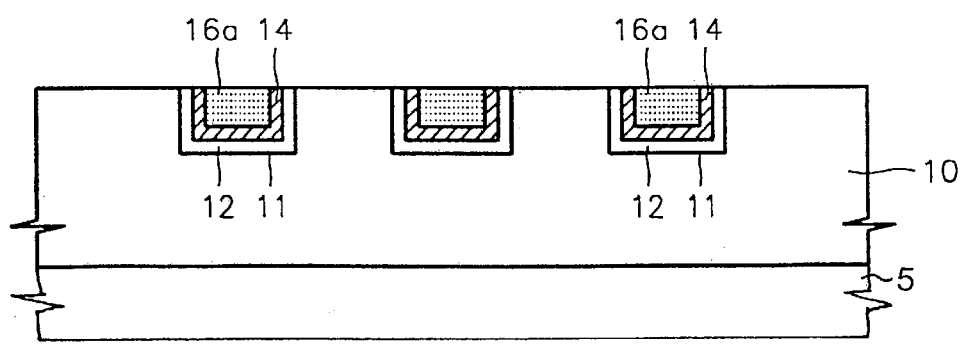
Figure 4:
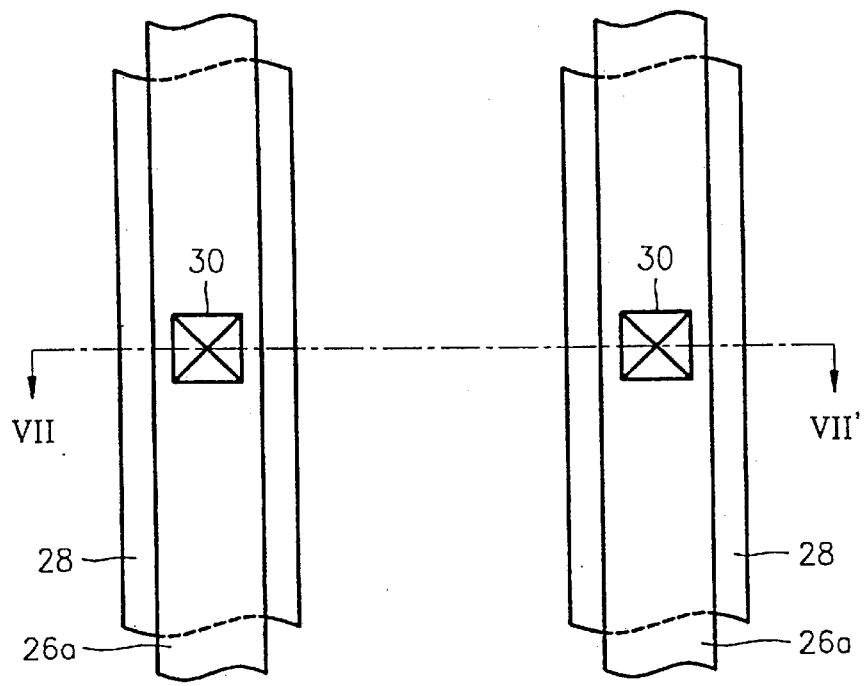
FIGS. 4 through 7 are a plan view and section views showing a method of forming a metal interconnection in a semiconductor device having a conventional dual damascene structure.
Figure 5:
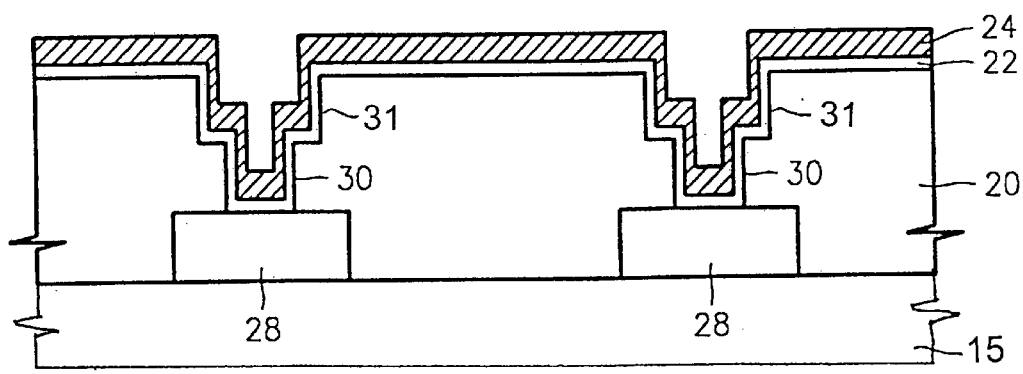
Figure 6:
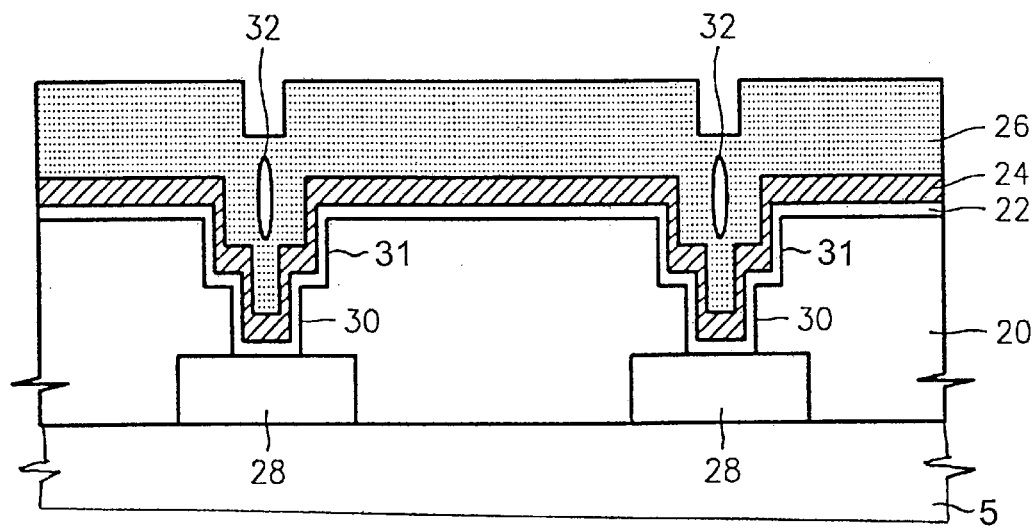
Figure 7:
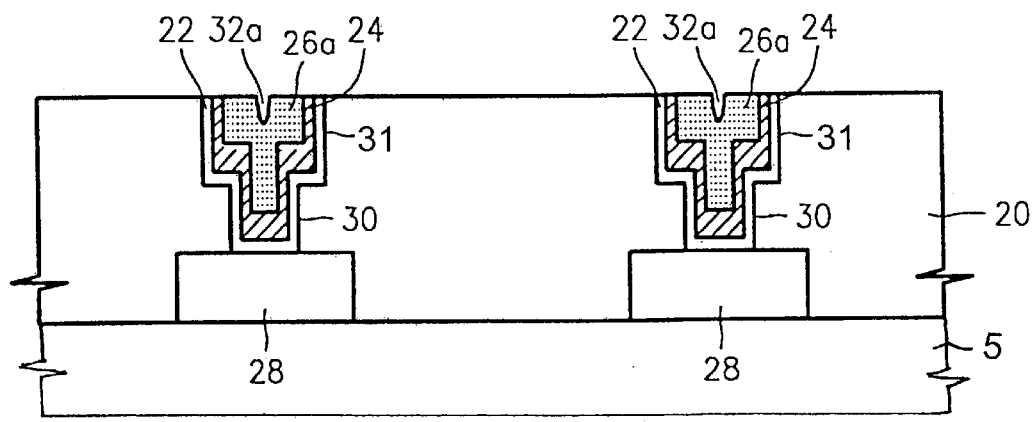
Figure 8:
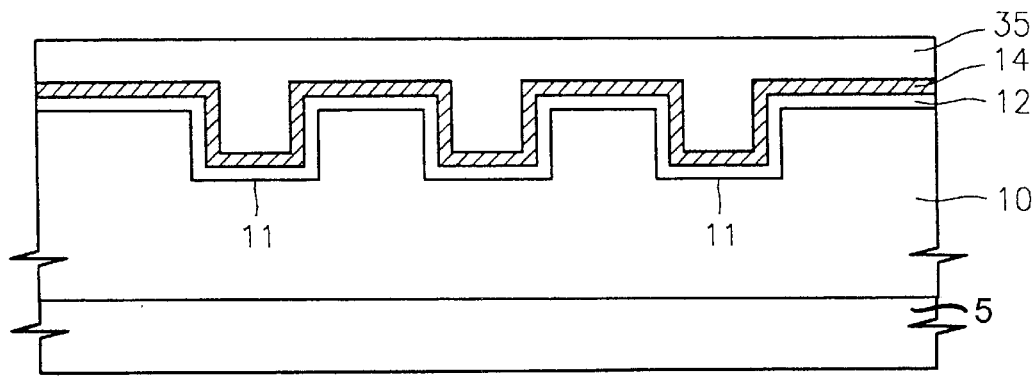
FIGS. 8 through 10 are sectional views showing a method of forming a metal interconnection in a semiconductor device having a line damascene structure according to a first preferred embodiment of the present invention.
Figure 9:
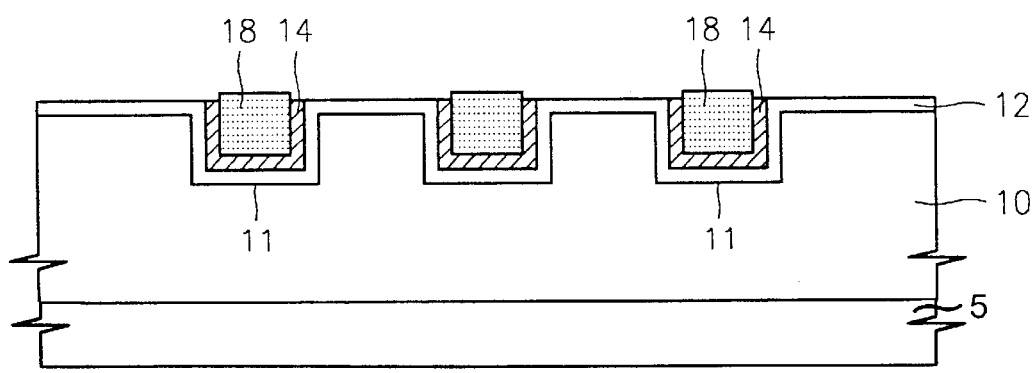
Figure 10:
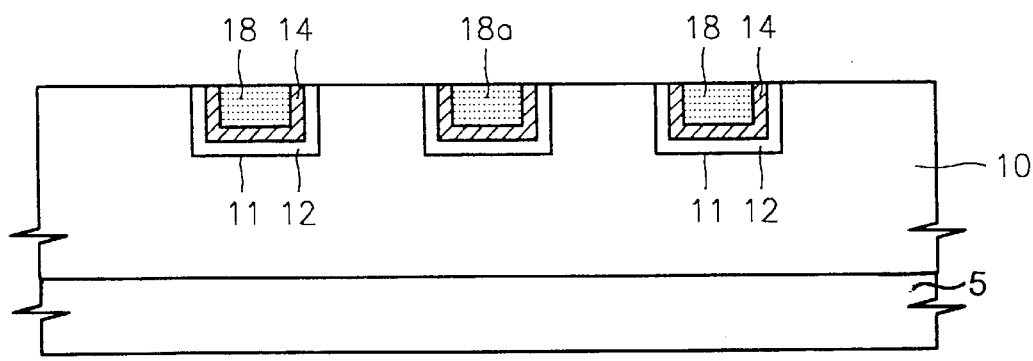

FIGS. 8 through 10 are sectional views showing a method of forming a metal interconnection according to a first preferred embodiment of the present invention. The first preferred embodiment is related to a method of forming a metal interconnection having a conventional line damascene structure described in FIGS. 1 through 3. As a result, similar elements are represented by the same reference numerals in these drawings.

Referring to FIG. 8, a trench region 11 is formed as a recess region in an insulation layer 10 over a substrate 5. A diffusion prevention layer 12 and a seed layer 14 are then sequentially formed over the entire surface of the substrate 5, including the trench area 11. Next, the seed layer 14 is removed so that it remains only in the trench area 11.

Although the drawing shows the insulation layer 10 formed directly over the substrate 5, an underlying layer or layers that have a conductivity or an insulating characteristic may be formed between the substrate 5 and the insulation layer 10.

More specifically, the insulation layer 10 may comprise silicon oxide, and may be formed over the substrate 5 and be etched by a typical photolithography process to form the trench region 11 in a recess region. The depth of the trench region 11 is preferably between 1000–30,000 Å.

In one method of forming the trench region 11, a silicon nitride film having an etching selectivity with respect to the silicon oxide layer is deposited over the silicon oxide layer formed on the insulation layer 10 to form an etching mask layer. The etching mask layer is then coated with a photoresist layer. A photoresist pattern and a silicon nitride film pattern are formed by a photolithography process and used for forming the trench region 11.

In another method, a photoresist layer may be immediately formed over the insulation layer 10, and then the trench region 11 may be formed by a direct photolithography process.

After the trench region 11 is formed, a diffusion prevention layer 12 is formed over the insulation layer 10 and in the trench region 11. The diffusion prevention layer 12 acts to improve adhesion to a succeeding interconnection metal and t prevent diffusion of the metal into the insulation layer 10.

The diffusion prevention layer 12 may comprise a tantalum (Ta) layer, a tantalum nitride (TaN) layer, a tantalum aluminum nitride (TaAlN) layer, a tantalum silicon nitride (TaSiN) layer, a tantalum silicide (TaSi$_2$) layer, a titanium (Ti) layer, a titanium nitride (TiN) layer, a titanium silicon nitride (TiSiN) layer, a tungsten nitride (WN) layer, a cobalt (Co) layer, a cobalt silicide (CoSi$_2$) layer, or a composite layer including at least two of these materials. The thickness of the diffusion prevention layer 12 is preferably between 100–1000 Å.

In forming the seed layer 14, a physical vapor deposition (PVD) method such as sputtering or a chemical vapor deposition (CVD) method may be used. When the CVD method is used, a material is relatively uniformly deposited over the surface, i.e., the vertical and horizontal surfaces, of the seed layer 14, as shown in FIG. 8. In contrast, when the PVD method is used, a material is deposited more thickly on the horizontal surface of the seed layer 14 than on the vertical surface parallel to the moving direction of the deposited material. This is caused by the directional properties of the deposited material.

The first preferred method uses a chemical mechanical polishing (CMP) process. In the CMP process, a given substrate is loaded into a polishing apparatus, the surface of the substrate, i.e., the top layers, to be polished is brought into contact with a pad provided in the polishing apparatus, a slurry is applied between the substrate and the pad, and the substrate and the pad are then rotated in opposite directions. During this polishing process, the height of the surface to be polished remains uniform.

When a CMP process is used in this embodiment, the portion of the seed layer 14 outside the trench region 11 contacts the pad of a polishing apparatus during the polishing process, and the process is performed until only the seed layer 14 within the trench region 11 remains. It is preferable that the slurry used for such a CMP process not include abrasives to prevent a slurry residue from remaining in the trench region 11 after the CMP process. The CMP process is preferably performed using a slurry having a polishing selection ratio of the seed layer 14 to the diffusion prevention layer 12 of about 10:1–1000:1.

The second method uses an etch back process. In an etch back process, the entire surface of a substrate exposed to an etching atmosphere is removed at a nearly uniform etching rate. Accordingly, an intermediate material layer 35 of FIG. 8 may be used in this embodiment of the present invention to selectively remove the seed layer 14. In other words, an intermediate material layer 35 having an excellent reflow characteristic, for example, a photoresist layer, may be thickly formed over the entire surface of the substrate including the trench region 11, and an etch back process performed on the resultant structure. The photoresist layer formed over the substrate 5 and the seed layer 14 outside the trench region are sequentially etched by the etch back process.

The portion of the seed layer 14 outside of the trench region 11 is then selectively removed so that the seed layer 14 remains only in the trench region 11. This has the result of exposing the diffusion prevention layer 12. One of the following two preferred methods may be used in selectively removing the seed layer 14.

The etch back process is performed until the diffusion prevention layer 12 outside the trench region 11 is exposed. Then the portion of the photoresist layer remaining in the trench region 11 is removed, for example, by an ashing process, so that only the seed layer 14 in the trench region 11 remains, as shown in FIG. 8.

Referring to FIG. 9, the resultant structure shown in FIG. 8 is loaded into a plating apparatus (not shown) containing a plating solution, and a plating process is performed to form a plating layer 18 in the trench region 11, over the seed layer 14. In this preferred embodiment of the present invention, copper is used for the plating layer, although any conductive metal material that will allow for a plating process may also be used.

For the plating process used in this embodiment, either an electroplating method or an electroless plating method can be used. For example, in a copper electroplating method, the substrate 5 including the seed layer 14 is put into an electrolyte including copper ions, and a voltage is applied to the substrate 5, which is defined as a cathode. Then, the copper plating layer 18 is selectively formed only on the seed layer 14.

Alternatively, in an electroless plating method, pretreatment, for example, palladium treatment, is performed on the substrate 5, including the seed layer 14, and the resultant structure is put into a plating solution including copper ions. Then, the copper plating layer 18 is selectively formed on only the seed layer 14. In either case, a plating process is performed until the plating layer 18 sufficiently fills the trench region 11.

Referring to FIG. 10, the entire surface of the structure is then planarized to leave a metal interconnection layer 18a only in the trench region 11. For the polarization, a CMP process or an etch back process can be performed, as described above. When a CMP process is performed, the surface of the substrate may be planarized either in a single step using a slurry having nearly the same polishing selection ratios with respect to the plating layer 18 and the diffusion prevention layer 12, or using separate processes that are applied to the plating layer 18 and the diffusion prevention layer 12 individually.

Second Preferred Embodiment

Figure 11:
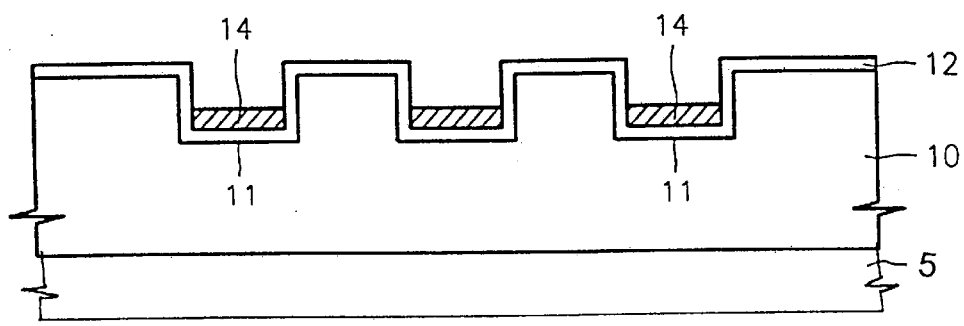
FIGS. 11 through 13 are sectional views showing a method of forming a metal interconnection in a semiconductor device having a line damascene structure according to a second preferred embodiment of the present invention.
Figure 12:
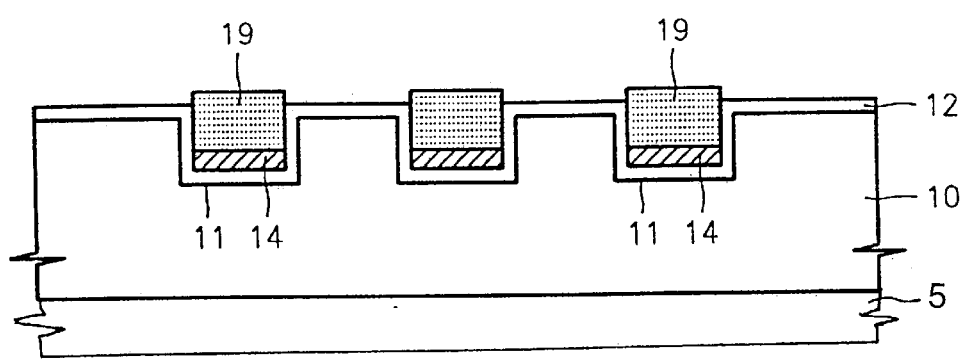
Figure 13:
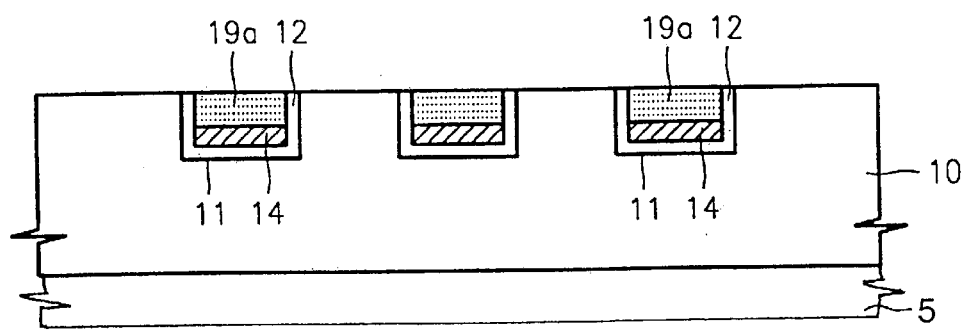

FIGS. 11 through 13 are sectional views showing a method of forming a metal interconnection according to a second preferred embodiment of the present invention. Like the first embodiment, the second embodiment is related to a method of forming a metal interconnection having a line damascene structure, as described in FIGS. 1 through 3. As a result, in the second preferred embodiment, elements that are similar to those in the first preferred embodiment are represented by the same reference numerals in the drawings.

Referring to FIG. 11, an insulation layer 10 is initially formed over a substrate 5. A trench region 11 is then formed at a recess region in the insulation layer 10. A diffusion prevention layer 12 and a seed layer 14 are then sequentially formed over the entire surface of the substrate 5, including the trench area 11. Finally, the seed layer 14 is removed so that it remains only in the bottom portion of the trench area 11.

Fundamentally the same processes as those of the first preferred embodiment are applied to the second preferred embodiment with the exception that a larger portion of the deposited seed layer 14 is removed such that it remains only in the bottom portion of the trench region 11. In this embodiment particularly, it is preferable to use a PVD method, such as sputtering (described above), in forming the seed layer 14. This is because in a PVD method, material is deposited more thickly on a horizontal surface of a layer (perpendicular to the moving direction of the deposited material) than on a vertical surface (parallel to the moving direction of the deposited material) as a result of the directional properties of the deposited material More specifically, when a wet etching process is performed on the substrate to remove the portions of the seed layer 14 not in the bottom portion and on the sidewalls of the trench region 11 as shown in FIG. 8, some portion of the seed layer in the trench region will be removed. If the seed layer 14 is relatively thinly formed on the sidewalls of the trench region 11, then it may be completely removed, while if the seed layer 14 is relatively thickly formed in the bottom portion of the trench region 11 it will remain after a predetermined time has passed.

When performing the wet etching process, an etchant suitable for the feature of the seed layer 14 can be used. For example, when the seed layer 14 is formed of copper, an etchant obtained by diluting sulfuric acid and hydrogen peroxide with ultra pure water may be used. The wet etching process is preferably performed over a controlled period of time such that a portion of the seed layer 14 remains in the bottom portion of the trench region 11, while the seed layer 14 is completely removed from the sidewalls of the trench region 11.

Referring to FIG. 12, in an manner similar to that of the first preferred embodiment, the resultant structure shown in FIG. 11 is loaded into a plating apparatus (not shown) containing a plating solution, and a plating process is performed to form a plating layer 19 in the trench region 11 over the seed layer 14. However, unlike the first preferred embodiment, the seed layer 14 does not exist on the sidewalls of the trench region 11 in this embodiment. Accordingly, the aspect ratio of the trench region 11 is low enough that the plating layer 19 can be satisfactorily formed without forming a void. Preferably the plating layer 19 is formed to sufficiently fill the trench region 11.

Referring to FIG. 13, the entire surface of the substrate, including the plating layer 19 and the diffusion prevention layer 12 is planarized to form a metal interconnection layer 19a only in the trench region 11. As described above with respect to the first preferred embodiment, a CMP process or an etch back process described before can be performed to achieve this polarization. When a CMP process is performed, it is preferable that the surface of the substrate be planarized in one step using slurry having nearly the same polishing selection ratios with respect to the plating layer 19 and the diffusion prevention layer 12.

Third Preferred Embodiment

Figure 14:
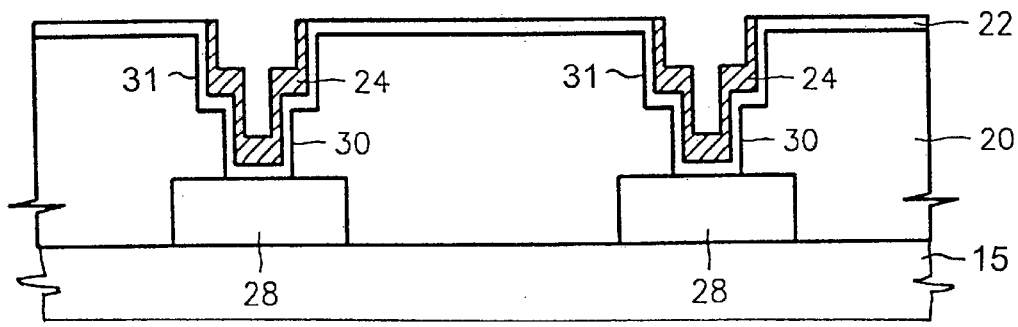
FIGS. 14 through 16 are sectional views showing a method of forming a metal interconnection in a semiconductor device having a dual damascene structure according to a third preferred embodiment of the present invention.
Figure 15:
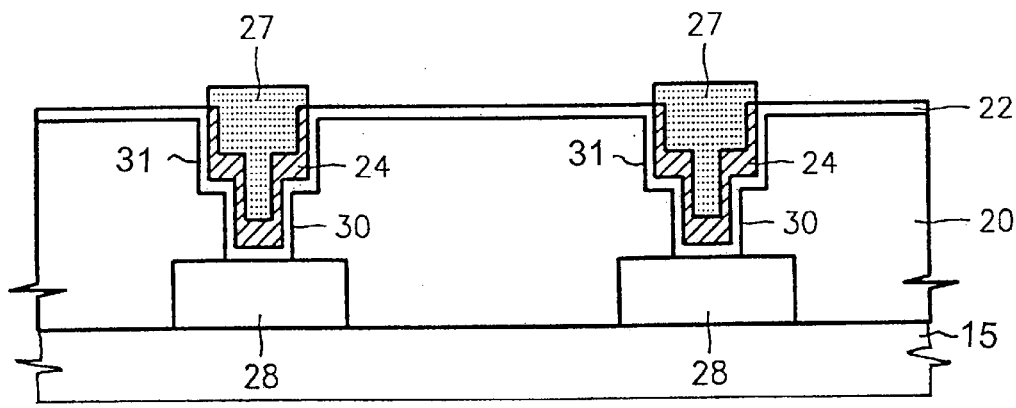
Figure 16:
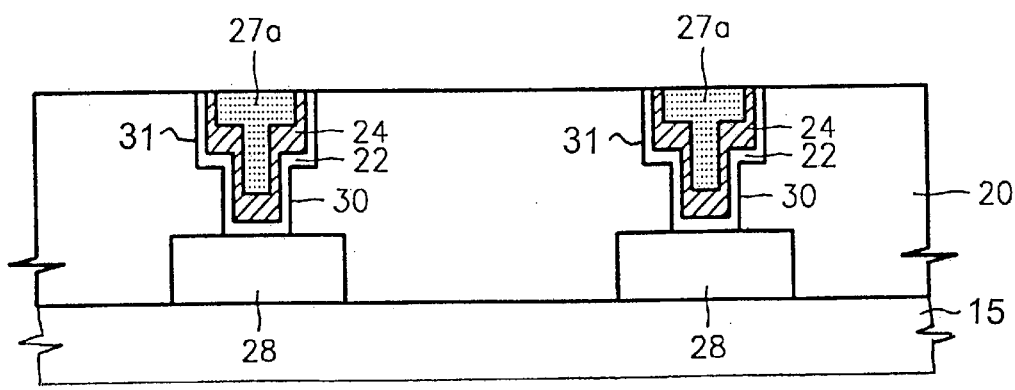

FIGS. 14 through 16 are sectional views that show a method of forming a metal interconnection according to a third preferred embodiment of the present invention. The third preferred embodiment is similar in some ways to a method of forming a metal interconnection having a conventional dual damascene structure, as described in FIGS. 4 through 7. As a result, similar elements are represented by the same reference numerals in these drawings.

Referring to FIG. 14, a lower conductive layer 28 and an insulation layer 20 are sequentially formed over a substrate 15. A contact hole region 30 and a trench region 31 then formed in the insulation layer 20 as a recess region, thereby forming a dual damascene structure. The contact hole region 30 is formed to expose the surface of the lower conductive layer 28 on the substrate. The trench region 31 is combined with the contact hole region 30 and together they form a line shape having a predetermined depth from the surface of the insulation layer 20. A diffusion prevention layer 22 and the seed layer 24 are sequentially formed on the entire surface of the substrate having the recess region, and then the seed layer 24 on the insulation layer 20 is removed so that the seed layer remains only in the recess region.

As in the first preferred embodiment, although the insulation layer 20 is shown as being formed directly over the substrate 15, one or more additional layers having a conductivity or an insulating characteristic may be formed between the insulation layer 20 and the substrate 15.

The depth of the trench region is preferably between 1000–30,000 Å. The diffusion prevention layer 22 may comprise a tantalum (Ta) layer, a tantalum nitride (TaN) layer, a tantalum aluminum nitride (TaAlN) layer, a tantalum silicon nitride (TaSiN) layer, a tantalum silicide ($TaSi_2$) layer, a titanium (Ti) layer, a titanium nitride (TiN) layer, a titanium silicon nitride (TiSiN) layer, a tungsten nitride (WN) layer, a cobalt (Co) layer, a cobalt silicide ($CoSi_2$) layer, or a composite layer including at least two of these materials. The thickness of the diffusion prevention layer 22 is preferably between 100–1000 Å.

The seed layer 24 is preferably made of copper, but may also be formed of a transition metal such as platinum, palladium, rubidium, strontium, rhodium, or cobalt. The seed layer 14 is preferably formed to a thickness of about 500–5,000 Å. The seed layer 24 may be formed by a PVD method, such as sputtering, or a CVD method.

After the seed layer 24 is deposited, a CMP process or an etch back process may be used to expose the diffusion prevention layer 22, as described above with respect to the first preferred embodiment. The CMP process or an etch back process will selectively remove a portion of the seed layer 24 outside of the recess region, allowing the seed layer 24 to remain only in the recess region, as shown in FIG. 14. Preferably, if a CMP Process is used, the slurry does not include abrasives as described with respect to the first preferred embodiment.

Referring to FIG. 15, the resultant structure shown in FIG. 14 is then loaded into a plating apparatus (not shown) containing a plating solution, and a plating process is performed to form a plating layer 27 only in the recess region, which has the seed layer 24. In this embodiment, either an electroplating method or an electroless plating method can be used for the plating process. The plating process is preferably performed until the plating layer 27 fills the recess region, as shown in FIG. 15.

Referring to FIG. 16, the entire surface of the substrate, including the plating layer 27 and the diffusion prevention layer 22 is planarized such that a metal interconnection layer 27a remains only in the recess region. For the polarization, a CMP process or an etch back process described before can be performed. When a CMP process is performed, the surface of the substrate is preferably planarized in a single step, using a slurry having nearly the same polishing selection ratios with respect to the plating layer 27 and the diffusion prevention layer 22.

Fourth Preferred Embodiment

Figure 17:
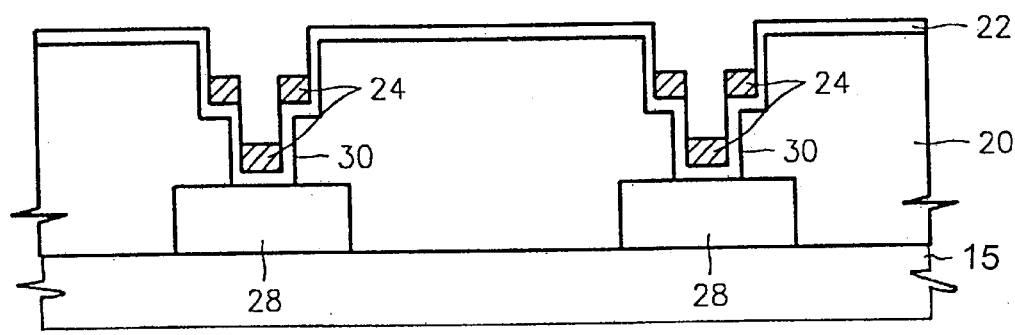
FIGS. 17 through 19 are sectional views showing a method of forming a metal interconnection in a semiconductor device having a dual damascene structure according to a fourth preferred embodiment of the present invention.
Figure 18:
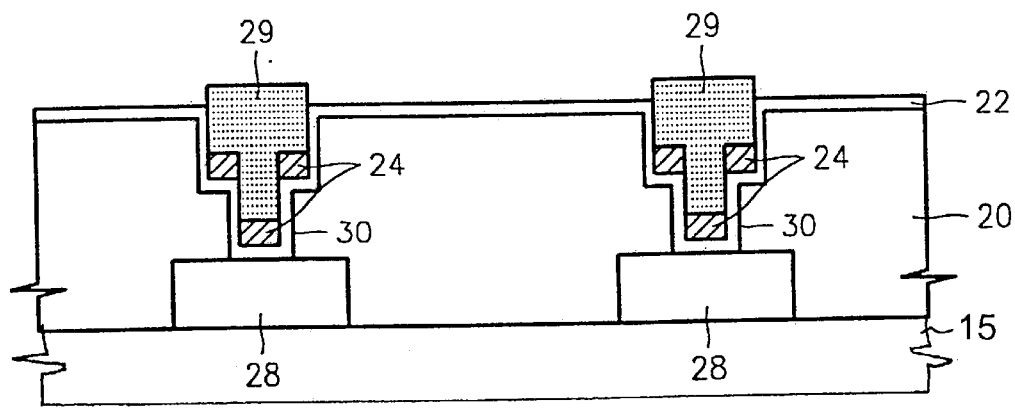
Figure 19:
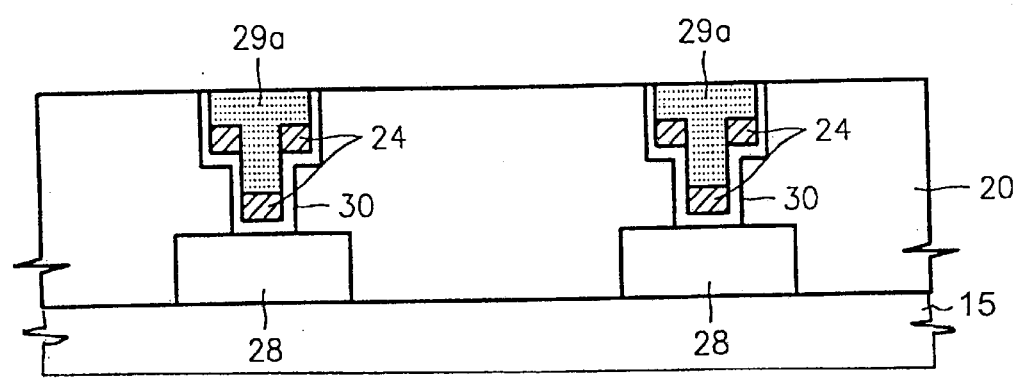

FIGS. 17 through 19 are sectional views that show a method of forming a metal interconnection according to a fourth preferred embodiment of the present invention. Like the third preferred embodiment, the fourth preferred embodiment is related to a method of forming a metal interconnection having a dual damascene structure. This embodiment is similar to the third preferred embodiment of FIG. 14, and so similar elements are represented by the same reference numerals in the drawings.

FIG. 17 is a sectional view of the structure obtained by performing a wet etching process on a structure a seed layer 24 only in the recess region as shown in FIG. 14. Fundamentally, the same processes as those of the third preferred embodiment are applied to this embodiment, with the exception that the seed layer 24 remains only in the bottom portion, i.e., the horizontal surface, of the recess region, as opposed to the sides as well.

In this embodiment, it is preferable to use a PVD method, such as sputtering, to form the seed layer 24 (as described above). The PVD method is preferable because it deposits material more thickly on the horizontal surface of a layer than on the vertical surface parallel to the moving direction of the deposited material. This is because of the directional properties of the deposited material.

Because of this, a wet etching process can be used to provide the structure shown in FIG. 17. After performing the PVD method to deposit the seed layer on the substrate, the seed layer 24 is formed on both the bottom portion and the sidewalls of the recess region, including the contact hole 30 and the trench region 31, as shown in FIG. 14. However, the seed layer 24 is formed relatively thinly on the sidewalls of the recess region, but is formed much more thickly on the bottom portion of the recess region. As a result, after a predetermined etching duration, the seed layer 24 is completely removed from the side wall, but remains on the bottom surfaces of the contact hole 30 and trench region 31.

The wet etching process is preferably performed by controlling the etching time such that a portion of the seed layer 24 remains in the bottom portion of the recess region, but the portion of the seed layer 24 on the sidewalls of the recess region is completely removed. However, in alternate embodiments, the etching time of the wet etching precess may be controlled such that a portion of the seed layer 24 remains on the sidewalls of the recess region.

Referring to FIG. 18, as in the third preferred embodiment, the resultant structure shown in FIG. 17 is loaded into a plating apparatus (not shown) that contains a plating solution, and a plating process is performed to form a plating layer 29 in the recess region, which contains the seed layer 24. Unlike the third preferred embodiment, however, in this embodiment, no portion of the seed layer 24 remains on the sidewalls of the recess region. Accordingly, the aspect ratio of the recess region is low, meaning that the plating layer 29 can be satisfactorily formed without forming a void.

Referring to FIG. 19, the entire surface of the substrate is then planarized to form a metal interconnection layer 29a that is only in the recess region. For the polarization, a CMP process or an etch back process can be performed as described above. If a CMP process is performed, it is preferable that the surface of the substrate is planarized in a single step using a slurry having nearly the same polishing selection ratios with respect to the plating layer 29 and the diffusion prevention layer 22.

While this invention has been particularly shown and described with reference to preferred embodiments thereof, it will be understood by those skilled in the art that various changes in form and details may be made therein. In particular, the present invention can be applied to a line damascene structure and a dual damascene structure and also applied to formation of a plug filling a contact hole or a via-hole in a single shape. In addition, various materials can be used for forming a plating layer as long as the material allows a plating process.

According to the present invention, first, a plating layer is formed only in a recess region in which a metal interconnection layer will be formed so that the plating layer does not have to be formed thicker than needed and the amount of metal to be polished during a subsequent CMP process or an etch back process can be greatly reduced. This improves throughput and decreases fabrication expense.

Second, since the amount of the plating layer to be polished by the polishing process is small, the uniformity of the polishing process in a given substrate is excellent, which can decrease the variation in the thicknesses of metal interconnection layers formed in the substrate. Moreover, this can prevent dishing or corrosion of the insulation layer because the polishing process does not need to be performed excessively, thereby improving the reliability of semiconductor devices.

Third, since a seed layer does not remain outside the recess region, the same slurry can be used with respect to the plating layer and a diffusion prevention layer during a CMP process, thus simplifying the fabrication process.

Fourth, even if the seed layer remaining on the sidewalls of the recess region is removed, the plating layer can be sufficiently formed. Accordingly, the aspect ratio of the recess region can be sufficiently low that the gap-filling performance of the plating layer is improved. Consequently, the reliability of semiconductor devices can be improved.

What is claimed is:

1. A method of forming a metal interconnection, the method comprising:

forming an insulation layer having an upper surface on a substrate;

forming a recess region in the insulation layer;

forming a diffusion prevention layer over the upper surface of the insulation layer and over the recess region formed in the insulating layer;

forming a metal seed layer over the diffusion prevention layer only in the recess region, wherein the diffusion prevention layer remains formed over the upper surface region of the insulating layer after the metal seed layer is formed only in the recess region; and forming, after said forming the metal seed layer only in the recess region, a conductive plating layer on the metal seed layer using a plating process;

wherein forming the metal seed layer comprises forming a preliminary seed layer over the diffusion prevention layer, and removing a first portion of the preliminary seed layer outside of the recess region such that a second portion of the preliminary seed layer in the recess region forms the metal seed layer.

2. A method of forming a metal interconnection, as recited in claim 1, wherein the recess region comprises a trench region of a line shape having a predetermined depth from a top surface of the insulation layer.

3. A method of forming a metal interconnection, as recited in claim 1, wherein the recess region, comprises:

a trench region of a line shape having a predetermined depth from the surface of the insulation layer; and a contact hole region passing through the insulation layer.

4. A method of forming a metal interconnection, as recited in claim 1, wherein forming the preliminary seed layer is performed by a physical vapor deposition (PVD) method or a chemical vapor deposition (CVD) method.

5. A method of forming a metal interconnection, as recited in claim 1, wherein removing a first portion of the preliminary seed layer is performed by a chemical mechanical polishing (CMP) process.

6. A method of forming a metal interconnection, as recited in claim 5, wherein a slurry used for the chemical mechanical polishing (CMP) process does not contain abrasives.

7. A method of forming a metal interconnection, as recited in claim 5, wherein the chemical-mechanical polishing (CMP) process uses a slurry having a polishing selection ratio of 10:1–1000:1 with respect to the preliminary seed layer and the diffusion prevention layer.

8. A method of forming a metal interconnection, as recited in claim 1, further comprising performing a surface polarization process on the conductive plating layer and the diffusion prevention layer to expose a top surface of the insulation layer and to form a metal interconnection layer in the recess region.

9. A method of forming a metal interconnection, as recited in claim 8, wherein the surface polarization is performed by a chemical mechanical polishing process using a slurry having nearly the same polishing speeds with respect to the diffusion prevention layer and the plating layer.

10. A method of forming a metal interconnection, the method comprising:

forming an insulation layer on a substrate;

forming a recess region in the insulation layer;

forming a diffusion prevention layer over insulation layer and the recess region;

forming a metal seed layer over the diffusion prevention layer only in the recess region; and forming a conductive plating layer on the seed layer using plating process;

wherein forming the metal seed layer comprises forming a preliminary seed layer over the diffusion prevention layer, and removing a first portion of the preliminary seed layer outside of the recess region such that a second portion of the preliminary seed layer in the recess region forms the metal seed layer;

wherein removing a first portion of the preliminary seed layer leaves the second portion of the preliminary seed layer and a third portion of the preliminary seed layer in the recess region, and further comprising performing a wet etching process on the third portion of the preliminary seed layer to remove the third portion of the seed layer from the recess region.

11. A method of forming a metal interconnection, as recited in claim 10, wherein the wet etching process is time-controlled.

12. A method of forming a metal interconnection, as recited in claim 11, wherein the second portion of the preliminary seed layer is formed only on a bottom surface of the recess region.

13. A method of forming a metal interconnection, the method comprising:

forming an insulation layer on a substrate;

forming a recess region in the insulation layer;

forming a diffusion prevention layer over insulation layer and the recess region;

forming a metal seed layer over the diffusion prevention layer only in the recess region; and forming a conductive plating layer on the seed layer using plating process;

wherein forming the metal seed layer comprises forming a preliminary seed layer over the diffusion prevention layer, and removing a first portion of the preliminary seed layer Outside of the recess region such that a second portion of the preliminary seed layer in the recess region forms the metal seed layer;

wherein removing a first portion of the preliminary seed layer further comprises:

forming an intermediate material layer over the preliminary seed layer to fill the recess region;

etching back and removing a first portion of the intermediate material layer and the first portion of the preliminary seed layer until a portion of the diffusion prevention layer outside the recess region is exposed; and removing a second portion of the intermediate material layer remaining in the recess region.

14. A method of forming a metal interconnection, as recited in claim 13, wherein the intermediate material layer comprises a photoresist material.

* * * * *